United States Patent [19]

Einarson

[11] 3,797,092

[45] Mar. 19, 1974

[54] DUAL IN LINE PACKAGE HANDLING TOOL

[75] Inventor: Norman S. Einarson, Burlington, Mass.

[73] Assignee: Solder Removal Company, Covina, Calif.

[22] Filed: Oct. 25, 1972

[21] Appl. No.: 300,769

[52] U.S. Cl. .............................................. 29/203 H
[51] Int. Cl. .............................................. H05k 13/04
[58] Field of Search..... 29/203 H, 203 HE, 203 HT, 29/206

[56] References Cited

UNITED STATES PATENTS 3,535,763 10/1970 Helton .............................. 29/203 H
3,602,971 9/1971 Halstead .............................. 29/206 X

*Primary Examiner*—Thomas H. Eager

[57] ABSTRACT

A tool for grasping and holding a dual in line electronic circuit package for insertion into a printed circuit board or connector. The tool engages the normally slightly diverging contact leads of the circuit package and bends them inwardly. The tool employs an adjustable stop to positively limit the amount of bending of the contact pins. An extraction tool is formed by a minor modification to the insertion tool, wherein the jaws are formed with teeth which pass between the contact leads and positively engage the body of the electronic package to facilitate removal of the package from its mounting.

13 Claims, 6 Drawing Figures

PATENTED MAR 19 1974 3,797,092

DUAL IN LINE PACKAGE HANDLING TOOL

FIELD OF THE INVENTION

This invention relates to tools for handling electronic components and more particularly concerns a plier type tool for positively grasping a dual in line electronic circuit package for insertion into or extraction from a mounting position.

DISCUSSION OF THE PRIOR ART

With the advent of complex electronic components mounted in relatively small packages there has arisen the need for tools for handling such components with their attendant multiplicity of contact leads. It has been common to use a tool having a U-shaped head with parallel sides which is forced down over the contact leads of such dual in line electronic packages. This type of tool thus frictionally engages the package leads and a centrally mounted plunger having the operating end located in the closed portion of the U-shaped tool head is operated to separate the package from the tool. An example of such a tool is shown in U.S. Pat. No. 3,535,763.

Tools of this type give rise to certain problems in use. When the leads of an electronic circuit package are forcibly frictionally engaged by such a tool, a significant number of such packages are damaged by deforming the leads or breaking one or more of the bonds where the contact lead enters the substrate. Furthermore, integrated circuit packages using the dual in line configuration are being made larger and larger, presently having as many as eighteen leads in each of two parallel facing rows. With only seven pins in each row the U-shaped tool has functioned reasonably well, but with a much larger number of leads it is very difficult to force the tool head over the diverging leads of such electronic circuit packages, and the chances for damaging a much more expensive package thereby increase significantly. Furthermore, none of the existing U-shaped insertion tools of the type mentioned have been designed so that a single tool can properly handle all dual in line packages of a particular nominal size. For example, a fourteen lead plastic unit may be slightly different in width than a fourteen lead ceramic unit. Also there are manufacturers tolerances which will be encountered in such circuit packages and hole location tolerances in the connector or printed circuit board must be accounted for.

There are many other circuit package insertion tools which are of a substantially different type, which are much more complicated or which are merely parts of automated machinery, but these are of no particular interest with respect to this invention.

It is also necessary to have tools for the extraction of a dual in line package from its mounting. This has often been done by a simple spring loaded tweezer-like tool which grasps opposite ends of the package and pulls it away from the mounting. This all too often results in damage or complete destruction of the removed electronic circuit package because of the stresses involved. Plier type tools designed for extracting such packages also may be available and one such device is shown in U.S. Pat. No. 3,602,971.

SUMMARY OF THE INVENTION

Broadly speaking, this invention is a uniquely formed two-element tool with elongated elements pivoted at a point intermediate their respective handles and jaws in a plier-like configuration. This tool is configured specifically for purposes of operating with dual in line electronic packages which may also be referred to as modular integrated circuit packages. The term "dual in line electronic circuit package" as used herein will be taken to encompass any unit having two rows of multiple contact leads extending from opposite edges of the package and may include integrated circuits and resistor networks, among others. Other terms which may be used for such units are "modular packages" or "modules." The rows of leads are normally bent to a generally diverging spaced facing relationship. The package itself is normally a two layer lamination with the leads projecting from between the laminates.

The tool of this invention is formed with stop means to prevent it from opening beyond a point which is just sufficient to permit the jaws to engage the largest electronic circuit package with which it is intended to operate. A second adjustable stop is also provided which prevents the jaws of the tool from closing more than an amount which is required to bend the contact leads inward to a position where they are substantially parallel and adapted to fit into parallel rows of holes in a connector or a printed circuit board. The inside portion of the jaws of the tool are constructed with shoulders against which the top of the dual in line package is seated when properly positioned in the tool. When the jaws are closed each and every contact lead is equally engaged by the forwardmost portion of the jaws so that the legs are all urged toward each other equally to facilitate mounting of the package. The adjustable stop permits the tool to account for tolerances and material variations of dual in line manufacturers as well as printed circuit board hole location tolerances.

The extraction tool employs substantially identically casted or molded tool elements except that the forwardmost portion of the jaws is formed with individual teeth which fit between the contact leads of the dual in line circuit package. As with the insertion tool, the extraction tool provides shoulders on which the top of the electronic package is seated and an adjustable stop to prevent the teeth from entering too far between the contact leads and possibly damaging the package. This tool is so constructed that the teeth enter under the package body a distance which is just sufficient for engagement therewith and to hold the package firmly against the shoulders, keeping an even pressure along the entire length of the body so that an upward thrust will positively and safely remove the package from its mounting.

BRIEF DESCRIPTION OF THE DRAWING

The objects, advantages and features of this invention will be more easily understood from the following detailed description when taken in conjunction with the accompanying drawing in which.

DESCRIPTION OF THE PREFERRED EMBODIMENTS

Figures 1, 2, 3, 4, 5, 6:
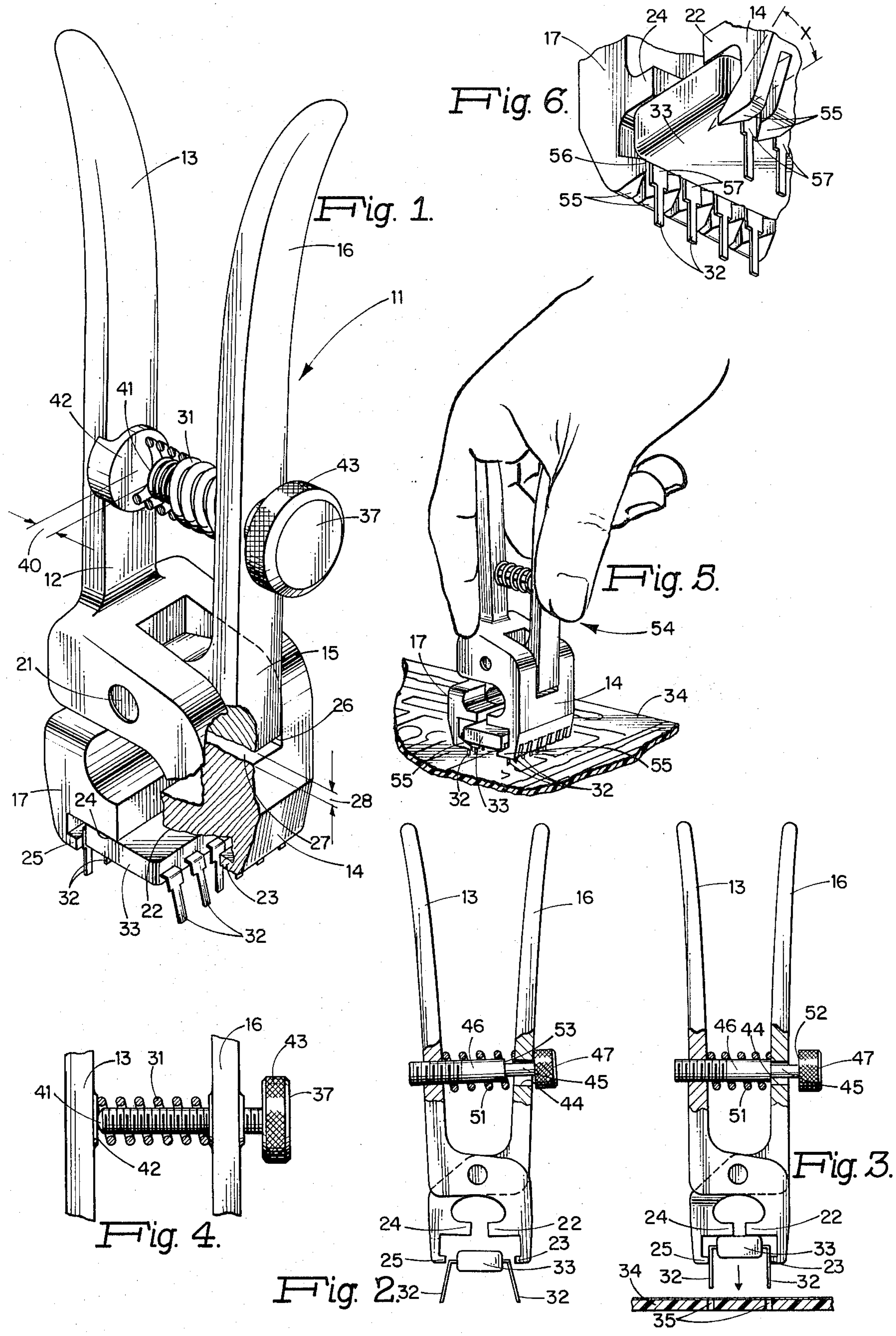
FIG. 1 is a perspective view of a dual in line package insertion tool constructed in accordance with this invention.
FIG. 2 is a reduced scale side view partially broken away of an insertion tool similar to FIG. 1 in a position just prior to engaging an electronic circuit package and showing an alternative stop arrangement.
FIG. 3 shows the tool of FIG. 2 having engaged the electronic circuit package with the package in position just prior to insertion into a printed circuit board.
FIG. 4 is an enlarged partial detail of the stop portion of the embodiment of FIG. 1.
FIG. 5 is a perspective view of the extraction tool of this invention in position just prior to engaging an electronic circuit module for removal of the module from a printed circuit board.
FIG. 6 is a partial enlarged perspective detail of the jaws of the tool of FIG. 5 in engaging position with an electronic modular circuit package.

With reference now to the drawing and more particularly to FIGS. 1–3 thereof there can be seen the detail of the construction and operation of the insertion tool of this invention. Insertion tool 11 is comprised of member 12 having a handle portion 13 and a jaw portion 14, and a member 15 having a handle portion 16 and a jaw portion 17. These elements fit together as shown and are pivotally interconnected by means of pivot pin 21. Jaw portion 14 is formed with forward facing shoulder 22 and lead engaging ridge 23 while jaw 17 is formed with forward facing shoulder 24 and lead engaging ridge 25. Forward facing shoulders 22 and 24 lie in substantially the same plane while lead engaging ridges 23 and 25 are in spaced confronting relationship.

Member 15 is formed with forward facing surface 26 in confronting relationship with rearward facing surface 27 of member 12. The aforesaid confronting surfaces are normally in abutting contact under the influence of bias spring 31 located between handles 13 and 16 and act as a stop. Thus it may be appreciated that the jaws may be opened only by a certain predetermined distance governed by the configurations of surfaces 26 and 27. The gap between these surfaces when the tool is in the closed position is indicated by space 28.

With tool 11 in its normally open position, FIG. 2 indicates that there is clearance between ridges 23, 25 and the respective adjacent contact leads 32 of dual in line package 33. When tool 11 is lowered over package 33 until shoulders 22 and 24 contact the top of the package, ridges 23 and 25 are closely adjacent or in contact with the sides of leads 32 below the point at which they are bent. By displacing handles 13 and 16 toward each other the jaws are closed by a predetermined distance to effectuate a substantially parallel configuration of the two rows of leads 32 as shown in FIG. 3. FIG. 3 also indicates a printed circuit board 34 having spaced rows of holes 35 for receiving contact leads 32.

The stop of the preferred embodiment for this tool in its normally open position has been described. The operating stop of this embodiment is shown in FIGs. 1 and 4 and comprises an adjustable screw 37 threadably engaged with handle 16 having an end 41 normally spaced by a distance indicated by reference numeral 40 from pad 42 formed in handle 13. Spring 31 may be mounted to either of the handles and preferably encircles the shank of screw 37 although it is not necessary that it do so. It may be noted that normally open space 40 and space 28 which exists when space 40 is closed are both shown open in FIG. 1. These spaces would not exist simultaneously but they are indicated in the same figure for purposes of convenience.

Some electronic modular packages vary in size slightly from others, that is, plastic dual in line packages tend to be of a slightly different width than are similar ceramic packages, even though they both are intended to be mounted into the same set of holes. The thickness of their respective leads also varies to some extent. In order to ensure that the contact leads are properly positioned for insertion into the mounting position as shown in FIG. 3 it is necessary that screw 37 be precisely adjusted so that end 41 of the screw will contact pad 42 when the legs of the modular circuit package are aligned with holes 35. Screw 37 is provided with a conventional knurled surface knob 43 to facilitate adjustment thereof.

It may thus be appreciated that this insertion tool is operationally quite flexible in that it can accommodate small but finite differences in sizes of the integrated circuit packages with which it is to be used, as well as differences in the spacing between rows of holes for receiving the contact leads of the package. Furthermore, it may also be adjusted to account for wear of the tool and specifically wear of the center of pad 42 as it comes in contact with the end of screw 37. Another aspect of the flexibility of this invention comes with the appreciation that the size of the jaws, specifically in the width dimension, may be formed as desired to accommodate dual in line packages having as few as six pins and as many as thirty-six pins, or as many as future technology requires. The only modification is a different mold for making a different size head while the remainder of the tool need not change. Furthermore, while the majority of dual in line packages have been of a relatively small size, approximately 5/16 of an inch wide, several of the more recent packages have been much wider, approximately ⅝ inch. The principles of this invention could be used in constructing a larger tool which would have jaws with the capacity to handle much larger dual in line packages.

An alternative dual stop mechanism replacing both stops depicted in FIG. 1 is shown in FIGS. 2 and 3. In this embodiment handle member 16 is provided with a clear bore 44 through which passes reduced diameter stem 45 of adjusting screw 46. Outside of handle 16 on stem 45 is mounted knurled knob 47. Handle member 13 is threaded and engages cooperating threads on screw 46. A bias spring 51 surrounds screw 46 similar to spring 31 in FIG. 1. In the normal open position of FIG. 2 the edge of bore 44 in handle 16 abuts inside edge 52 of knob 47 and acts as a stop to prevent further opening of the jaws of tool 11. When the handles are displaced toward one another as shown in FIG. 3, shoulder 53 of screw 46 abuts the inside of handle 16 adjacent bore 44 providing a positive stop in the closed position of the jaws. While the operable distance between the open and closed position of the tool of this embodiment remains substantially constant for all positions of the stop mechanism, it may be appreciated that the stop mechanism is as easily adjustable and is as positive for both open and closed positions as is the stop shown in FIg. 2. There are many other types of stops and biasing means which could be used with this invention and those shown are merely examples. A leaf spring could be used in place of the coil shown or a spring could be incorporated into the pivot for biasing purposes.

The extraction tool 54 is shown in FIGS. 5 and 6. It will be noted that this modified embodiment has a structure which is substantially identical to that which has been described above in connection with the insertion tool. The primary difference is that the forwardmost portions of jaws 14 and 17 are formed with regularly spaced teeth 55 which are adapted to fit between each of the contact leads 32 of modular circuit package 33. The confronting ends 56 of the teeth project inwardly a distance which corresponds to the confronting faces of ridges 23 and 25 of the embodiment shown in FIG. 1. Either stop mechanism previously discussed may be employed with the extraction tool. The object is to permit the tool to normally open sufficiently so that teeth 55 clear leads 32 and to permit it to close only enough so that when the tips of the teeth are beneath the body of package 33, the bottom corners of the package are engaged by the inner surface of the teeth disposed at an angle X with respect to the forward end of the teeth, thereby holding the package snugly but not tightly against shoulders 22 and 24. In this way the module may be easily lifted out of its mounting without the possibility of damage to the leads and without creating stresses in and possible delamination of the package. The lifting force is evenly distributed over the length of both sides of the circuit module so that there is substantially no squeezing force on the body thereof, while the module is positively held between the teeth and shoulders as described above, thereby preventing any uneven forces from occurring as the module is lifted.

It will be noted that each lead 32 has a portion 57 of enlarged width which is too large to fit through the holes in the circuit board. The shoulders formed by these enlarged portions extend below the bottom surface of body 33 of the package and maintain the body raised above the surface of circuit board 34. To remove the module from its mounting, tool 54 is placed into position to engage the circuit package and closed to the positive stop position where package body 33 is snugly wedged between the interior slope of teeth 55 and shoulders 22 and 24. At this point teeth 55 are between leads 32 as shown in FIG. 6, and the package is held firmly and evenly throughout its length. By being positively held within the jaws 14 and 17, there is no likelihood that any uneven torque or stress can be applied to the dual in line package, even if the tool is tilted as the module is lifted out of its mounting. Thus any possibility of damage to the laminated package is substantially reduced.

In view of the above detailed description, it is likely that changes, modifications and improvements which are within the scope of the invention will occur to those skilled in this art.

What is claimed is:

1. A tool for handling electronic modular circuit packages having two rows of nearly parallel diverging spaced contact leads, said tool comprising:

a first elongated member having a handle portion and a jaw portion;

a second elongated member having a handle portion and a jaw portion, said first and second members being pivotally interconnected at a point intermediate their respective handles and jaws so that said handles may be cooperatively manipulated to open and close said jaws, said jaws each being formed with a shoulder projecting inwardly and having a surface facing the forward end of said tool; and first stop means coacting with said first and second members and acting to permit said jaws to close only to a positively adjustable predetermined spaced relationship.

2. The tool recited in claim 1 wherein each said jaw is further formed with a ridge extending across the full width of the forward end thereof, said ridges on said jaws projecting inwardly toward each other in confronting spaced relationship.

3. The tool recited in claim 2 wherein said shoulders are spaced rearwardly of said ridges, said shoulders being adapted to abut the top of said package while said ridges engage the contact leads extending therefrom.

4. The tool recited in claim 1 wherein the forward surfaces of said shoulders define a plane spaced rearwardly from the forward ends of said jaws.

5. The tool recited in claim 3 wherein said first stop means is adjustable so that said rows of contact leads are brought into substantially parallel relationship with said jaws are closed to the limit permitted by said first stop means.

6. The tool recited in claim 1 wherein said first and second members are formed with abutting surfaces which act as a second stop means to limit the oepning of said jaws to a predetermined spacing greater than the spacing between said jaws permitted by said first stop means.

7. The tool recited in claim 6, further comprising a spring between said first and second members urging them apart so that said tool is normally in its open position as limited by said second stop means.

8. The tool recited in claim 1 wherein said first stop means comprises a shaft having one end threaded and adjustably engaging one of said handles at said threaded end, said shaft being formed with a reduced diameter portion adjacent the other end terminated by shoulders at either end of said reduced diameter portion, said reduced diameter portion passing through a bore in the other of said handles, the distance between the open position and the closed position of said tool being defined for any setting of said shaft by the constant distance between said shoulders at either end of said reduced diameter portion.

9. The tool recited in claim 1 wherein each said jaw is further formed with spaced teeth in a row extending across the full width of the forward end thereof, said rows of teeth on said jaws projecting inwardly toward each other in confronting spaced relationship.

10. The tool recited in claim 9 wherein said teeth are spaced forward of said shoulders and include an inner sloping surface extending rearwardly from the inwardly projecting ends of said teeth, said shoulders being adapted to abut the top of said package while said teeth extend between said contact leads and said sloping surfaces engage the bottom corner of said package.

11. The tool recited in claim 10 wherein said first stop means is adjustable so that the tips of said teeth extend under said package sufficiently for said sloping surface to urge said package snugly against said shoulders when said jaws are closed to the limit permitted by said first stop means.

12. A tool for handling electronic modular circuit packages having two rows of nearly parallel diverging spaced contact leads, said tool comrising:

a first elongated member having a handle portion and a jaw portion;

a second elongated member having a handle portion and a jaw portion, said first and second members being pivotally interconnected at a point intermediate their respective handles and jaws so that said handles may be cooperatively manipulated to open and close said jaws;

first stop means mounted between said first and second members and acting to permit said jaws to close only to an adjustably predetermined spaced relationship; and a spring between said first and second members urging them apart so that said tool is normally in an open position;

second stop means between said first and second members to limit the normally open position of said jaws to a predetermined spacing;

said jaws being formed with ridges at their forward ends extending across the full width thereof and projecting inwardly toward each other in confronting spaced relationship, said jaws also being formed with inwardly extending forward facing shoulders rearwardly spaced from said ridges, said shoulders being adapted to abut the top of said package while said ridges engage said contact leads and urge them into substantially parallel relationship when said jaws are closed to the limit permitted by said first stop means.

13. A tool for handling electronic modular circuit packages having two rows of nearly parallel diverging spaced contact leads, said tool comprising:

a first elongated member having a handle portion and a jaw portion;

a second elongated member having handle portion and a jaw portion, said first and second members being pivotally interconnected at a point intermediate their respective handles and jaws so that said handles may be cooperatively manipulated to open and close said jaws;

first stop means mounted between said first and second members and acting to permit said jaws to close only to an adjustably predetermined spaced relationship;

a spring between said first and second member urging them apart so that said tool is normally in an open position; and second stop means between said first and second members to limit the normally open position of said jaws to a predetermined spacing;

each of said jaws being formed with a row of spaced teeth extending across the full width of the forward end thereof, said rows of teeth projecting inwardly toward each other in confronting spaced relationship, said jaws also being formed with inwardly extending forward facing shoulders rearwardly spaced from said teeth, said shoulders being adapted to abut the top of said package while said teeth extend between said contact leads and engage the bottom of said package, said first stop means being adjustable so that the tips of said teeth extend under said package sufficiently for engagement of the bottom corners thereof when said jaws are closed to the limit permitted by said first stop means.

* * * * *